United States Patent
Nguyen et al.

(10) Patent No.: US 10,639,867 B2
(45) Date of Patent: May 5, 2020

(54) SAPPHIRE AND GLASS LAMINATES WITH A GRADIENT LAYER

(71) Applicant: Apple Inc., Cupertino, CA (US)

(72) Inventors: Que Anh S. Nguyen, San Jose, CA (US); Dale N. Memering, San Francisco, CA (US); Christopher D. Jones, Los Gatos, CA (US); Matthew Rogers, San Jose, CA (US)

(73) Assignee: Apple Inc., Cupertino, CA (US)

( * ) Notice: Subject to any disclaimer, the term of this patent is extended or adjusted under 35 U.S.C. 154(b) by 217 days.

(21) Appl. No.: 15/711,851

(22) Filed: Sep. 21, 2017

(65) Prior Publication Data
US 2018/0086026 A1  Mar. 29, 2018

Related U.S. Application Data

(60) Provisional application No. 62/399,089, filed on Sep. 23, 2016.

(51) Int. Cl.
| | | |
|---|---|---|
| B32B 15/20 | (2006.01) | |
| C03C 3/12 | (2006.01) | |
| G06F 3/0488 | (2013.01) | |
| C30B 29/20 | (2006.01) | |
| B32B 9/00 | (2006.01) | |
| B32B 17/06 | (2006.01) | |
| B32B 5/14 | (2006.01) | |
| B32B 7/10 | (2006.01) | |

(52) U.S. Cl.
CPC .............. *B32B 15/20* (2013.01); *B32B 5/145* (2013.01); *B32B 7/10* (2013.01); *B32B 9/005* (2013.01); *B32B 17/06* (2013.01); *C03C 3/125* (2013.01); *C30B 29/20* (2013.01); *G06F 3/0488* (2013.01); *B32B 2457/208* (2013.01)

(58) Field of Classification Search
CPC ...................................................... B32B 17/06
See application file for complete search history.

(56) References Cited

U.S. PATENT DOCUMENTS

| | | | |
|---|---|---|---|
| 2013/0236699 A1 | 9/2013 | Prest et al. | |
| 2014/0087197 A1* | 3/2014 | Weber | G02B 1/105 428/432 |
| 2014/0162043 A1 | 6/2014 | Schmid | |
| 2014/0335335 A1* | 11/2014 | Koch, III | G02B 1/105 428/213 |
| 2015/0248142 A1 | 9/2015 | Qian et al. | |
| 2016/0109982 A1 | 4/2016 | Lee et al. | |
| 2016/0270247 A1 | 9/2016 | Jones et al. | |

OTHER PUBLICATIONS

International Search Report and Written Opinion in PCT Application No. PCT/US2017/052971, dated Jan. 9, 2018 in 11 pages.
International Patent Application No. PCT/US2017/052971, "International Preliminary Report on Patentability", dated Apr. 4, 2019, 7 pages.

* cited by examiner

*Primary Examiner* — Ian A Rummel
(74) *Attorney, Agent, or Firm* — Kilpatrick Townsend and Stockton, LLP

(57) ABSTRACT

A sapphire sheet is laminated to a glass sheet with a gradient layer that transitions from a composition of predominantly $Al_2O_3$ at the sapphire sheet to a composition of predominantly $SiO_2$ at the glass sheet. The gradient layer chemically bonds to both the sapphire sheet and the glass sheet and has no distinct interfaces.

18 Claims, 9 Drawing Sheets

SAPPHIRE AND GLASS LAMINATES WITH A GRADIENT LAYER

CROSS-REFERENCES TO OTHER APPLICATIONS

This application claims priority to U.S. provisional patent application Ser. No. 62/399,089, for "SAPPHIRE AND GLASS LAMINATES WITH A GRADIENT LAYER" filed on Sep. 23, 2016 which is hereby incorporated by reference in entirety for all purposes.

FIELD

The described embodiments relate generally to electronic devices that employ a transparent cover glass disposed over a display screen. The transparent cover glass forms an exterior portion of the enclosure of the electronic device and protects the display screen from damage. More particularly, the present embodiments relate to a cover glass formed from a sapphire sheet laminated to a glass sheet with a gradient layer that transitions from a composition of predominantly $Al_2O_3$ at the sapphire sheet to a composition of predominantly $SiO_2$ at the glass sheet.

BACKGROUND

Many portable electronic devices, such as smart phones and tablet computers, include a touch sensitive display. The display typically includes part of a stack of components that includes a display screen, a touch sensitive layer overlaying the display screen and an outer monolithic transparent glass sheet, often referred to as a "cover glass," that protects the display and touch sensitive layer. As the cover glass is a portion of the outer enclosure of the electronic device, the cover glass needs to be strong and resistant to scratches and other damage that can occur if the portable electronic device is dropped or if the display region undergoes an impact event.

The cover glass used for many portable electronic devices is typically made of a chemically-strengthened glass that provides improved fracture resistance to certain drop and impact events as compared to standard glass. The strengthened glass is, however, inherently softer than some other material options, which can lead to scratches formed on the surface of the glass that are detrimental to both user perception and to the reliability of the cover glass, as the scratches can reduce the fracture strength of the glass.

SUMMARY

Embodiments of the present disclosure pertain to a cover glass that can be used in an electronic device, such as a smart phone or tablet computer. In some embodiments a sapphire sheet is bonded to an underlying and thicker glass sheet using a gradient layer disposed between the sapphire and glass. The resulting cover glass can include a sapphire outer surface that has increased hardness, stiffness, and/or impact resistance as compared to the inner glass portion of the cover glass.

Some embodiments relate to a gradient layer that that is deposited on one side of the sapphire sheet and transitions from a composition of predominantly $Al_2O_3$ at the sapphire sheet to a composition of predominantly $SiO_2$ at the opposite surface. A first annealing process can be used to nucleate nanocrystals at the sapphire sheet interface and chemically bond the gradient layer to the sapphire sheet. The glass sheet can be placed on the predominantly $SiO_2$ opposite surface of the gradient layer and a second, lower temperature annealing process can be used to bond the gradient layer to the glass sheet. After the annealing processes, the sapphire-glass laminate is a monolithic structure in which the gradient layer gradually changes from $Al_2O_3$ to $SiO_2$ with no distinct interfaces. The sapphire-glass laminate can exhibit excellent optical properties and improved reliability as compared to traditional cover glass designs.

In some embodiments an electronic device including a transparent cover glass comprises a housing, a display positioned within the housing and a cover glass disposed over the display and attached to the housing. The cover glass comprises a sapphire sheet, a glass sheet and a gradient layer disposed between the sapphire sheet and the glass sheet. The gradient layer transitions from a composition that is predominantly $Al_2O_3$ at the sapphire sheet to a composition that is predominantly $SiO_2$ at the glass sheet.

In various embodiments the gradient layer gradually transitions from a composition that is predominantly $Al_2O_3$ at the sapphire sheet to a composition that is predominantly $SiO_2$ at the glass sheet. In some embodiments the gradient layer includes a layer of $Al_2O_3$ nanocrystals disposed at an interface between the sapphire sheet and the gradient layer. In various embodiments the gradient layer is between 25 and 300 nanometers thick.

In some embodiments a glass and sapphire laminate comprises a sapphire sheet, a glass sheet and a gradient layer disposed between the sapphire sheet and the glass sheet. The gradient layer transitions from a composition that is predominantly $Al_2O_3$ at the sapphire sheet to a composition that is predominantly $SiO_2$ at the glass sheet. In various embodiments the gradient layer includes a layer of $Al_2O_3$ nanocrystals disposed at an interface between the sapphire sheet and the gradient layer.

In some embodiments the $Al_2O_3$ nanocrystals have a crystalline orientation that matches a crystalline orientation of the sapphire sheet. In various embodiments the $Al_2O_3$ nanocrystals have a crystalline orientation that is different from a crystalline orientation of the sapphire sheet. In some embodiments when moving in a direction away from the sapphire sheet, the gradient layer transitions from the layer of $Al_2O_3$ nanocrystals to a mixture of $Al_2O_3$ nanocrystals and amorphous $Al_2O_3$. In various embodiments when moving in a direction away from the sapphire sheet, the gradient layer transitions from the mixture of $Al_2O_3$ nanocrystals and amorphous $Al_2O_3$ to predominantly amorphous $SiO_2$.

In some embodiments the gradient layer gradually changes in chemical composition from predominantly $Al_2O_3$ to predominantly $SiO_2$. In various embodiments the gradient layer is between 25 and 300 nanometers thick. In some embodiments the sapphire sheet is between 5 and 100 microns thick. In some embodiments the glass sheet is between 100 and 1000 microns thick. In various embodiments the gradient layer is a first gradient layer and the laminate further comprises a second gradient layer that is disposed on the sapphire sheet on a side opposite of the first gradient layer.

In some embodiments a method of bonding a sapphire sheet to a glass sheet comprises depositing a gradient layer on a first surface of the sapphire sheet, wherein the gradient layer is predominantly composed of $Al_2O_3$ at the sapphire sheet and transitions to predominantly $SiO_2$ at an outer surface of the gradient layer. The method further comprises annealing the sapphire sheet and the gradient layer at a temperature sufficient to chemically bond the gradient layer to the sapphire sheet and disposing a glass sheet on the outer surface of the gradient layer. The glass sheet, the gradient layer and the sapphire sheet are annealed at a temperature sufficient to chemically bond the glass sheet to the gradient layer.

In some embodiments the gradient layer is deposited as an amorphous layer having a substantially linear gradient that varies from predominantly $Al_2O_3$ at the sapphire sheet to predominantly $SiO_2$ at an outer surface of the gradient layer. In various embodiments the sapphire sheet is annealed at a temperature above a softening point of the glass sheet. In some embodiments annealing the sapphire sheet and the gradient layer causes a layer of $Al_2O_3$ nanocrystals to form at an interface between the gradient layer and the sapphire sheet. In various embodiments the gradient layer is also deposited on a second surface of the sapphire sheet that is opposite the first surface.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION

Some embodiments of the present disclosure relate to a cover glass that can be used in an electronic device, such as a smart phone or tablet computer. While the present disclosure can be useful for a wide variety of configurations, some embodiments of the disclosure are particularly useful for a cover glass made from a laminate of glass and sapphire sheets bonded together with a gradient layer that transitions from a composition of predominantly $Al_2O_3$ at the sapphire sheet to a composition of predominantly $SiO_2$ at the glass sheet. The laminate of glass and sapphire can exhibit improved optical properties and reliability as compared to traditional cover glass configurations.

For example, in some embodiments a gradient layer is deposited on one surface of a sapphire sheet. The gradient layer is amorphous and transitions from a composition of predominantly $Al_2O_3$ at the sapphire sheet to a composition of predominantly $SiO_2$ at the opposite surface. A first annealing process is performed that chemically bonds the gradient layer to the sapphire sheet and forms $Al_2O_3$ nanocrystals at the sapphire surface. The glass sheet is then placed on the opposite surface, that is predominantly $SiO_2$, of the gradient layer and a lower temperature second annealing step is performed to chemically bond the glass sheet to the gradient layer.

In order to better appreciate the features and aspects of laminated sapphire and glass cover glass for electronic devices according to the present disclosure, further context for the disclosure is provided in the following section by discussing one particular implementation of an electronic device according to embodiments of the present disclosure. These embodiments are for example only and other embodiments can be employed in other electronic devices such as, but not limited to computers, watches, media players and other devices.

Figure 1:
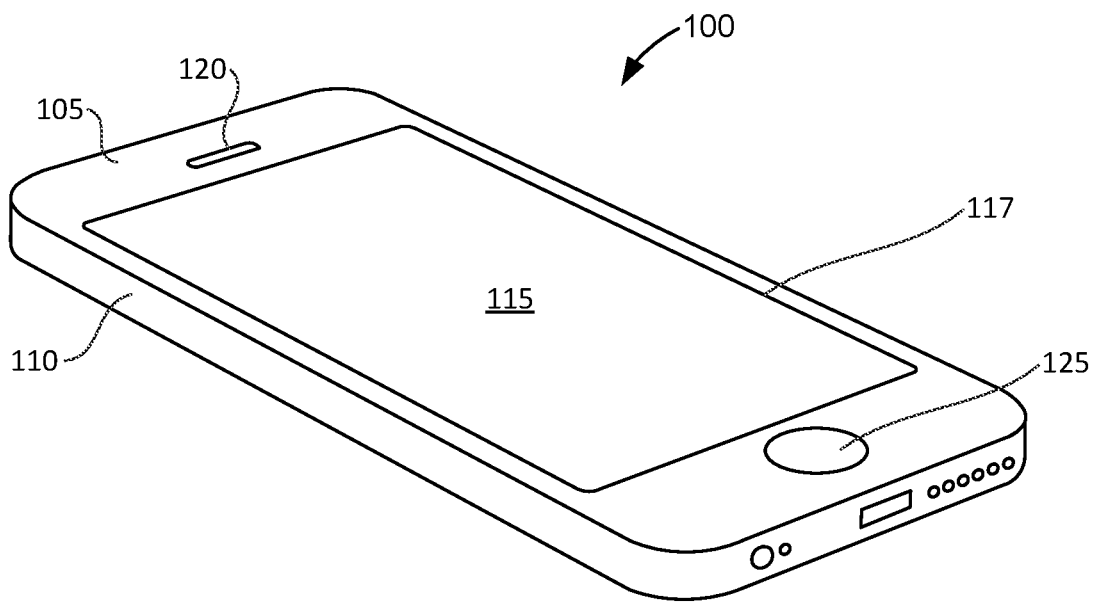
FIG. 1 depicts a simplified perspective view of an electronic device 100 that can include a cover glass according to embodiments of the disclosure.

FIG. 1 depicts a simplified perspective view of an electronic device 100 that can include a cover glass according to embodiments of the disclosure. As shown in FIG. 1, electronic device 100, which in this example is a smart phone, includes a cover glass 105 attached to a housing 110 and positioned at least partially over display 117. Cover glass 105 and housing 110 combine to provide an enclosure that houses the various electronic components of electronic device 100 including a processor, communication circuitry, display 117, camera and battery, among other components (not all shown in FIG. 1). Cover glass 105 is transparent and includes a central area 115 that corresponds to display 117, and outside the central display area includes a small cut out 120 for a receiver and an area for an input button 125 near the top and bottom of electronic device 100, respectively. In some embodiments cover glass 105 provides protection for display 117 and can also form a continuous transparent surface of the enclosure for electronic device 100.

Figure 2:
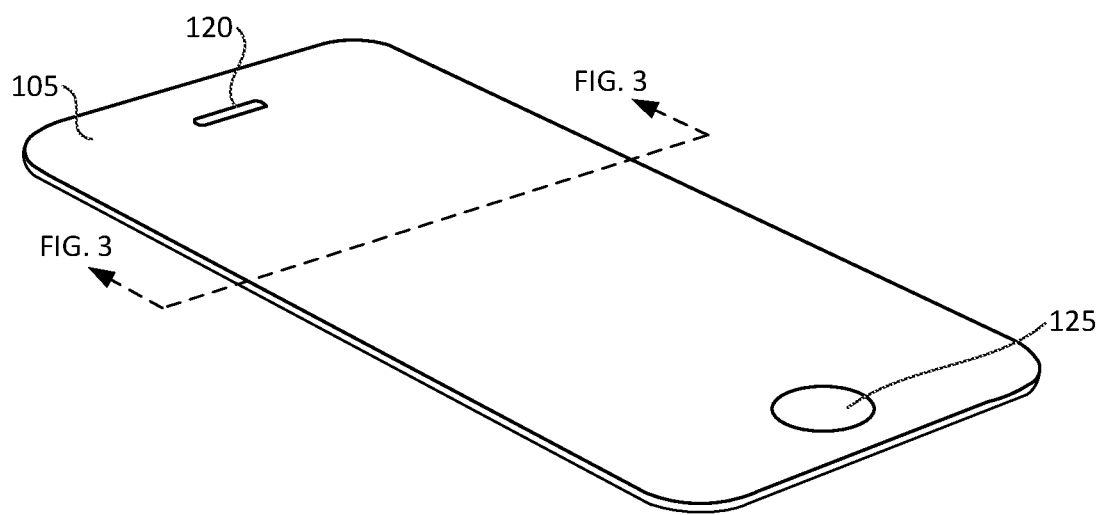
FIG. 2 is a simplified perspective view of the cover glass illustrated in FIG. 1.

FIG. 2 is a simplified perspective view of the cover glass illustrated in FIG. 1. As shown in FIG. 2, cover glass 105 is removed from housing 110 (see FIG. 1). While not visible in FIG. 2, in some embodiments cover glass 105 can include one or more thin sapphire sheets bonded to an underlying base layer (sheet) of glass with a gradient layer as discussed in more detail below.

Figure 3A:
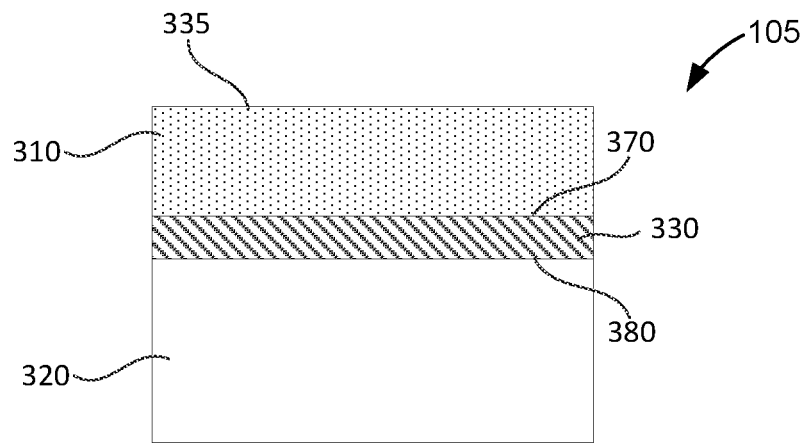
FIGS. 3A and 3B are simplified cross-sectional views of the cover glass illustrated in FIGS. 1 and 2, according to some embodiments of the disclosure.

FIG. 3A is a simplified partial cross-sectional view of the cover glass illustrated in FIGS. 1 and 2, according to embodiments of the disclosure. As shown in FIG. 3A, cover glass 105 can include a relatively thin sapphire sheet 310 adhered to a thicker glass sheet 320 using a gradient layer 330.

Sapphire sheet 310 can form an outer surface 335 of cover glass 105 when the cover glass is incorporated into an electronic device, such as electronic device 100 illustrated in FIG. 1. Since sapphire sheet 310 is considerably harder than glass or strengthened glass that is typically used as a cover glass, cover glass 105 is more resistant to scratching and damage than traditional cover glass. Further, since gradient layer 330 is used to bond sapphire sheet 310 to glass sheet 320, cover glass 105 is reliable (e.g., does not delaminate) and has a relatively low amount of internal reflection, as described in more detail below.

In some embodiments, gradient layer 330 is a layer that gradually changes in composition from predominantly $Al_2O_3$ at a first interface 370 (between sapphire sheet 310 and gradient layer 330) to predominantly $SiO_2$ at a second interface 380 (between glass sheet 320 and gradient layer 330). The gradual change in composition allows gradient layer 330 to chemically bond to both sapphire sheet 310 and glass sheet 320 forming a reliable and solid composite structure. Further, since gradient layer 330 has no distinct interfaces and gradually changes in composition, it exhibits less internal reflection than there would be if sapphire sheet 310 were directly bonded to glass sheet 320. Therefore, gradient layer 330 provides a reliable interface between sapphire sheet 310 and glass sheet 320, with a low amount of internal reflection.

Figure 3B:
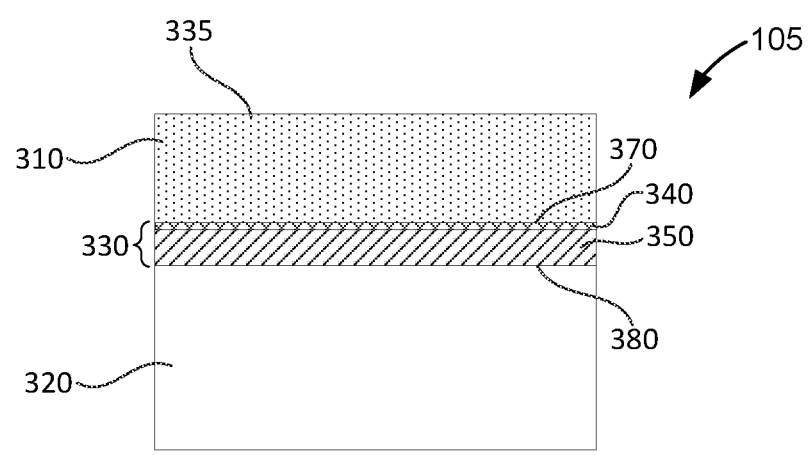

In some embodiments, as shown in FIG. 3B, one or more annealing processes can be employed to form an aluminum rich nano-crystalline $Al_2O_3$ layer 340 within gradient layer 330 to increase the strength of the bond between sapphire sheet 310 and glass sheet 320, as described in more detail below.

In some embodiments, glass sheet 320 can be a transparent glass sheet that can be made from any glass material, including chemically strengthened glass. In one embodiment glass sheet 320 is made from silicon dioxide ($SiO_2$). In another embodiment glass sheet 320 is made from "blue glass" that blocks at least a portion of the infra-red spectrum. Any other type of glass can be used including glass having one or more coatings applied to it that limit reflection and/or transmission of certain wavelengths of light. While embodiments of the disclosure are not limited to any particular thickness of glass sheet 320, in some embodiments the glass sheet is between 100 to 1000 microns thick, while in other embodiments the glass sheet is between 300 to 800 microns thick and in further embodiments the glass sheet is between 400 to 700 microns thick.

In some embodiments, sapphire sheet 310 is a layer of crystalline $Al_2O_3$ and can have one or more coatings applied to it that limit reflection and/or transmission of certain wavelengths of light. While embodiments of the disclosure are not limited to any particular thickness of sapphire sheet 310, in some embodiments the sapphire sheet is between 5 to 100 microns thick, while in other embodiments the sapphire sheet is between 10 to 80 microns thick and in further embodiments the sapphire sheet is between 20 to 70 microns thick.

Figure 4:
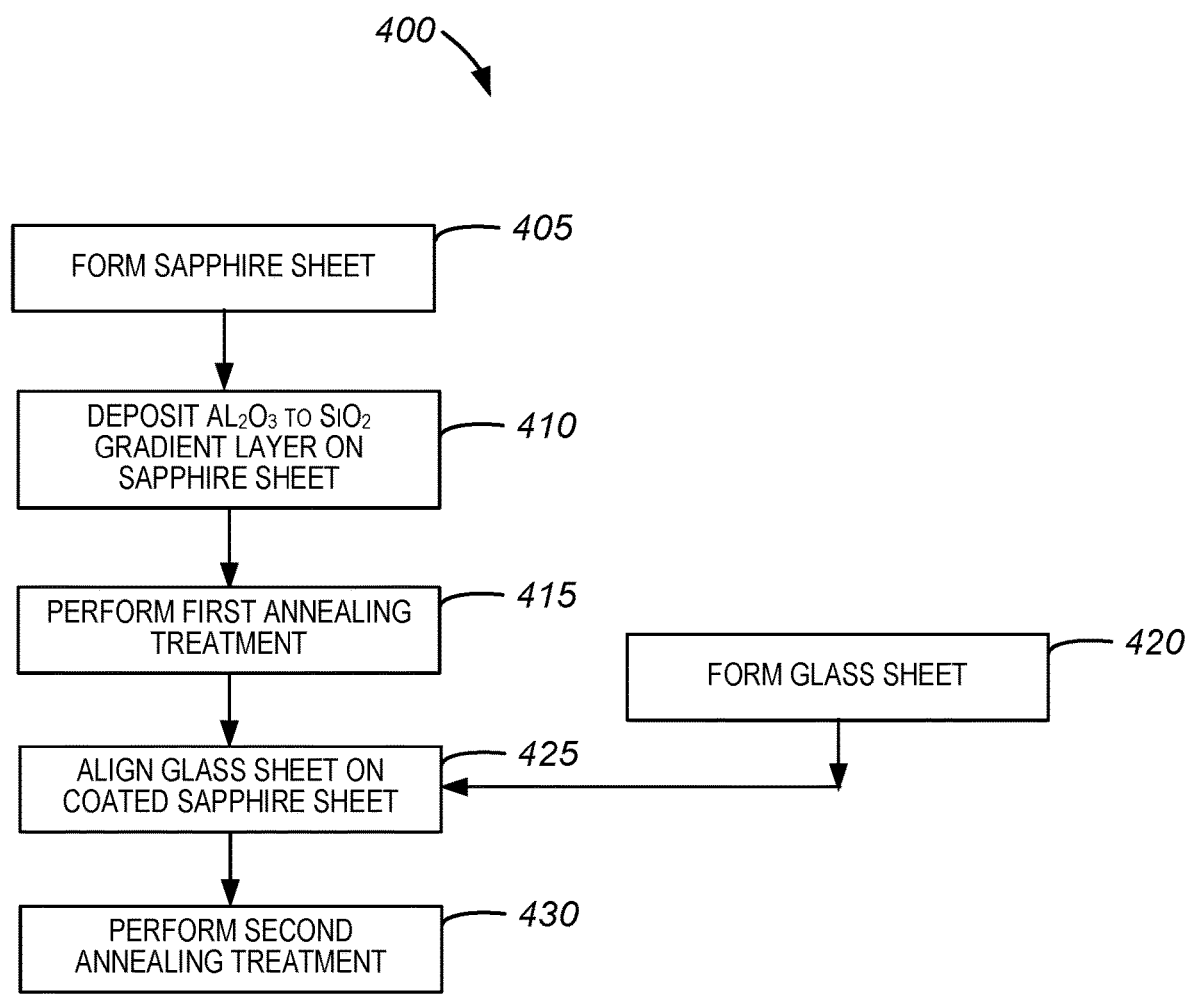
FIG. 4 illustrates steps associated with a method of bonding a sapphire sheet to a glass sheet according embodiments of the disclosure.
Figure 5A:
FIGS. 5A-5E illustrate simplified cross-sectional views of a sapphire sheet being bonded to a glass sheet according to the method described in FIG. 4.
Figure 5B:
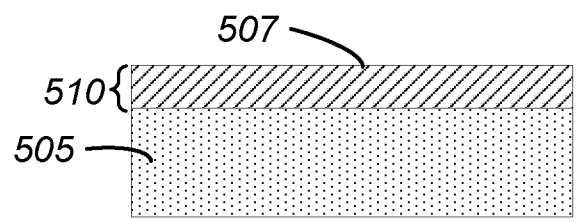

FIG. 4 illustrates steps associated with a method of bonding a sapphire sheet to a glass sheet according embodiments of the disclosure. FIGS. 5A-5E illustrate simplified cross-sectional views of a sapphire sheet being bonded to a glass sheet according to the method described in FIG. 4. As shown in FIG. 4, method 400 includes forming a sapphire sheet (step 405) using any appropriate manufacturing technique. Referring to FIG. 5A, sapphire sheet 505 is provided. In some embodiments sapphire sheet 505 is between 5 to 100 microns thick, while in other embodiments the sapphire sheet is between 10 to 80 microns thick and in further embodiments the sapphire sheet is between 20 to 70 microns thick.

Ian step 410 an $Al_2O_3$ to $SiO_2$ gradient layer 510 (see FIG. 5B) is deposited on sapphire sheet 505. Gradient layer 510 is formed on one surface of sapphire sheet 505. In some embodiments gradient layer 510 can be deposited using a physical vapor deposition (PVD) sputtering process in which separate silicon and aluminum targets are positioned within the PVD chamber and the PVD process is controlled such that the deposited gradient layer 510 has a substantially linear gradient that varies from a relatively high concentration of $Al_2O_3$ and a relatively low concentration of $SiO_2$ at the surface of sapphire sheet 505 to a relatively low concentration of $Al_2O_3$ and relatively high concentration of $SiO_2$ at an outer surface 507 of the gradient layer. In other embodiments the composition of gradient layer 510 is not substantially linear and can have any composition profile. Other deposition techniques than PVD can be used to form gradient layer 510 and are within the scope of this disclosure.

In some embodiments, gradient layer 510 can be an amorphous layer deposited, for example, to between 25 to 300 nanometers thick, while in other embodiments it can be between 50 to 200 nanometers thick and in further embodiments between 50 to 100 nanometers thick. In various embodiments in which it is desirable to minimize internal reflection within the composite cover glass, the thickness of gradient layer 510 can be selected to be above 50 microns. In various embodiments the thickness of gradient layer 510 can be selected to be above 100 microns to achieve a further reduction in internal reflection within the composite cover glass.

In step 415 a first annealing treatment on sapphire sheet 505 with $Al_2O_3$ to $SiO_2$ gradient layer 510 is performed. The first annealing treatment is performed at a temperature sufficient to chemically bond gradient layer 510 to sapphire sheet 505 can be above a temperature that glass sheet 530 (which is not subjected to the high temperature anneal) would melt. In some embodiments the first annealing treatment is performed in an inert or non-inert atmosphere at a final annealing temperature greater than 1000° C. In another embodiment the final annealing temperature of the first annealing treatment can be above 1200° C. In one embodiment the first annealing treatment temperature ramps to the final annealing temperature in four to six hours, is held at the final annealing temperature for approximately two hours, then ramps back to the ambient temperature over approximately 16 hours. In other embodiments different temperatures and ramp profiles can be used, including laser annealing, as described in more detail below.

Figure 5C:
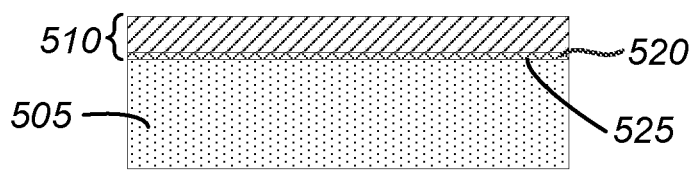

As shown in FIG. 5C, in some embodiments, the first annealing treatment causes a layer of nano-crystals 520 of $Al_2O_3$ to form on an inner layer 525 of sapphire sheet 505. More specifically, during the relatively high temperatures in the first annealing treatment, nano-crystals nucleate on the crystalline lattice of sapphire sheet 505. In some embodiments the nano-crystals have the same crystalline orientation as sapphire sheet 505 while in other embodiments the nano-crystals can have a different orientation than the sapphire sheet. The nano-crystals nucleate out of gradient layer 510 and grow during the first annealing treatment. The amount and size of the nano-crystals that are formed can be controlled by controlling the time and temperature profile of the first annealing treatment.

In step 420, which can be performed independent of steps 405 to 415, method 400 includes forming a glass sheet 530 using any appropriate manufacturing technique. In some embodiments glass sheet 530 is provided that is between 100 to 1000 microns thick, while in other embodiments the glass sheet is between 300 to 800 microns thick and in further embodiments the glass sheet is between 400 to 700 microns thick. In various embodiments glass sheet 530 is made from silicon dioxide and can be chemically strengthened and/or configured to block infra-red light.

Figure 5D:
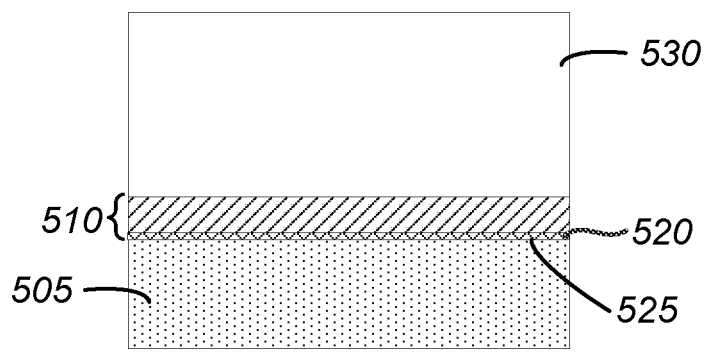

In step 425, glass sheet 530 is aligned with and placed on top of gradient layer 510, as illustrated in FIG. 5D.

Figure 5E:
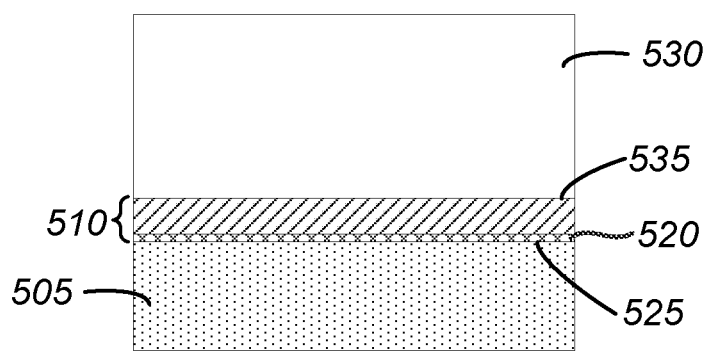

In step 430 a second annealing treatment is performed at a lower temperature than the first annealing treatment described in step 415. In some embodiments the second annealing treatment is performed in an ambient atmosphere and at a final annealing temperature of approximately 125° C. As shown in FIG. 5E, in some embodiments, the second annealing treatment causes gradient layer 510, which is rich in $SiO_2$ at the interface between the gradient layer and glass sheet 530, to chemically bond to glass sheet 530. In some embodiments pressure can be applied between sapphire sheet 505 and glass sheet 530 during the second annealing treatment to ensure the surfaces are intimately bonded.

Figure 6:
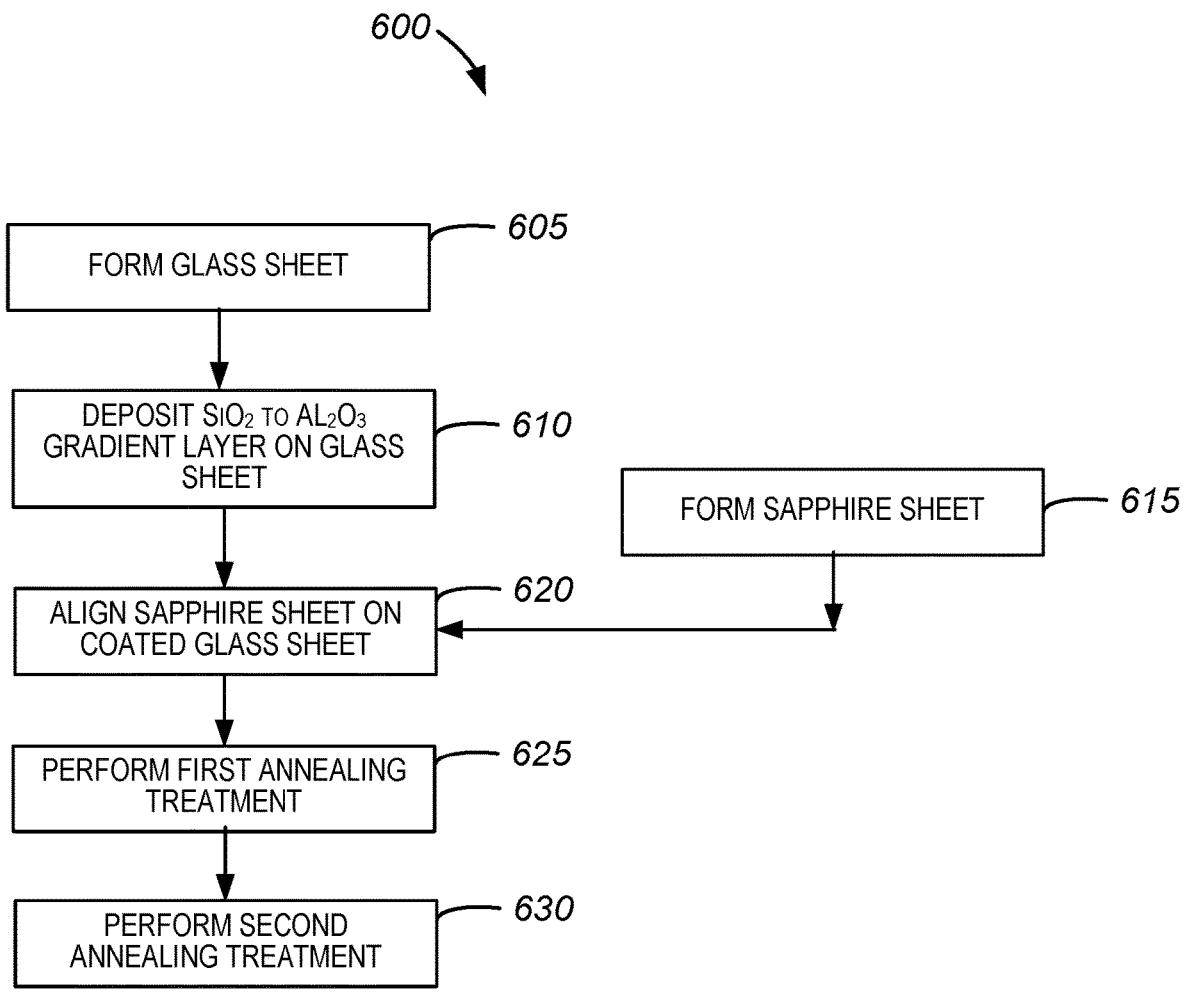
FIG. 6 illustrates steps associated with a method of bonding a sapphire sheet to a glass sheet using laser annealing according embodiments of the disclosure.

FIG. 6 illustrates steps associated with a method of bonding a sapphire sheet to a glass sheet using a laser annealing process according embodiments of the disclosure. FIGS. 7A-7E illustrate simplified cross-sectional views of a sapphire sheet being bonded to a glass sheet according to the method described in FIG. 6. As described in FIG. 6, a gradient layer is deposited on the glass sheet instead of on the sapphire sheet as discussed above.

Figure 7A:
FIGS. 7A-7E illustrate simplified cross-sectional views of a sapphire sheet being bonded to a glass sheet according to the method described in FIG. 6.
Figure 7B:
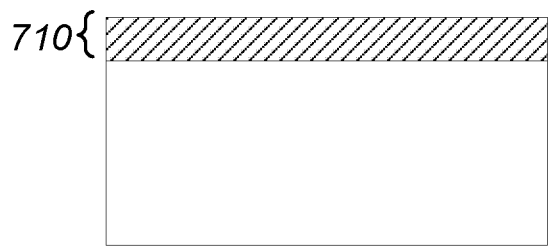

As shown in FIG. 6, method 600 includes forming glass sheet (step 605) using any appropriate manufacturing technique. Referring to FIG. 7A, glass sheet 705 is provided that can be between 100 to 1000 microns thick, while in other embodiments the glass sheet is between 300 to 800 microns thick and in further embodiments the glass sheet is between 400 to 700 microns thick. In various embodiments glass sheet 705 is made from silicon dioxide and can be chemically strengthened and/or configured to block infra-red light.

In step 610 a $SiO_2$ to $Al_2O_3$ gradient layer 710 (see FIG. 7B) is deposited on one side of glass sheet 705. In some embodiments gradient layer 710 is an amorphous layer deposited using the same type of PVD sputtering process described above with respect to FIG. 4 except that gradient layer 710 varies from a very high concentration of $SiO_2$ and very low concentration of $Al_2O_3$ to a very low concentration of $SiO_2$ and high concentration of $Al_2O_3$ at the outer surface of the gradient layer. More specifically, in this embodiment gradient layer 710 starts with $SiO_2$ instead of $Al_2O_3$ so the $SiO_2$ can form a bond with glass sheet 705. In some embodiments the composition of gradient of layer 710 can be linear while in other embodiments it can be non-linear.

In some embodiments, gradient layer 710 can be an amorphous layer deposited, for example, to between 25 to 300 nanometers thick, while in other embodiments it can be between 50 to 200 nanometers thick and in further embodiments between 50 to 100 nanometers thick. In various embodiments in which it is desirable to minimize internal reflection within the composite cover glass, the thickness of gradient layer 710 can be selected to be above 50 microns. In some embodiments the thickness of gradient layer 710 can be selected to be above 100 microns to achieve a further reduction in internal reflection within the composite cover glass.

Figure 7C:
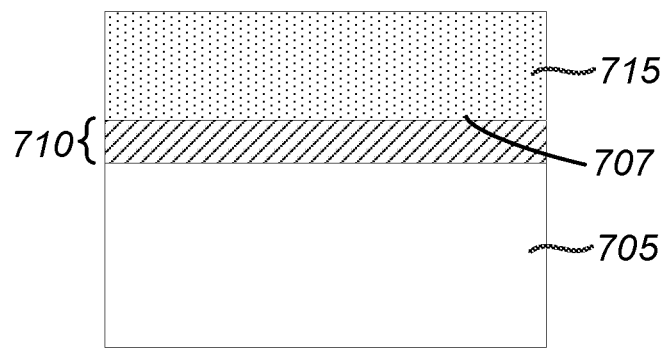

In step 615 a sapphire sheet of $Al_2O_3$ is formed using any appropriate manufacturing technique. Referring to FIG. 7C, sapphire sheet 715 is provided. In some embodiments sapphire sheet 715 is between 5 to 100 microns thick, while in other embodiments the sapphire sheet is between 10 to 80 microns thick and in further embodiments the sapphire sheet is between 20 to 70 microns thick.

In step 620 sapphire sheet 715 is aligned with glass sheet 705 and placed in direct contact with gradient layer 710 (see FIG. 7C).

In step 625 a first annealing treatment is performed on sapphire sheet 715 and gradient layer 710. In some embodiments the first annealing treatment is performed in an ambient atmosphere using a laser that is transmitted through sapphire sheet 715 and focused at or near interface 707 between the sapphire sheet and gradient layer 710 to heat the interface to a temperature that is sufficient to cause atomic level bonding between the sapphire sheet and the $Al_2O_3$-rich portion of the gradient layer without substantially softening glass sheet 705. In one embodiment the laser is configured to heat up the interface to a temperature of greater than 1000° C. while in other embodiments it can heat up the interface to a temperature of greater than 1200° C.

Figure 7D:
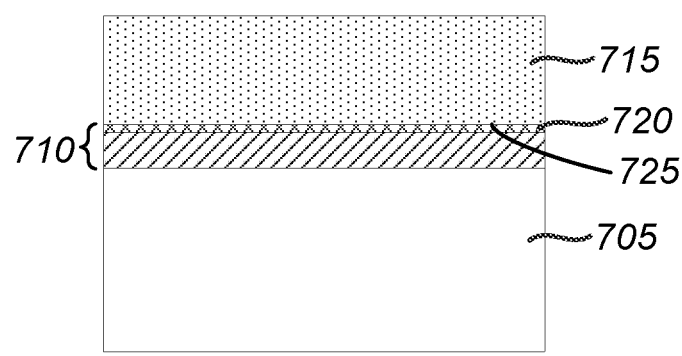

As shown in FIG. 7D, in some embodiments, first annealing treatment performed in step 625 causes a layer of nano-crystals 720 of $Al_2O_3$ to form on an inner layer 725 of sapphire sheet 715. More specifically, during the relatively high temperatures generated during the first annealing treatment, nano-crystals nucleate on the crystalline lattice of sapphire sheet 715. In some embodiments the nano-crystals have the same crystalline orientation as sapphire sheet 715 while in other embodiments the nano-crystals can have a different orientation than the sapphire sheet. The nano-crystals nucleate out of gradient layer 710 and grow during the first annealing treatment. The amount and size of the nano-crystals that are formed can be controlled by controlling the time and temperature profile of the first annealing treatment performed in step 625.

Figure 7E:
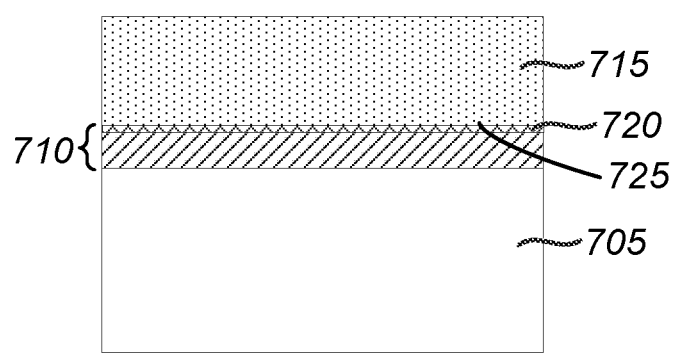

In step 630 a second annealing treatment on the materials is performed at a lower temperature than the first annealing treatment performed in step 625. In some embodiments the second annealing treatment can be performed in an ambient atmosphere and at a final annealing temperature of approximately 125° C. In some embodiments the second annealing treatment can be performed in an oven or using a laser at a final annealing temperature that is below a softening point of glass sheet 705. In one example, the second annealing treatment performed in step 630 heats the interface between glass sheet 705 and gradient layer 710 to a temperature of approximately 125° C. As shown in FIG. 7E, in some embodiments, the second annealing treatment causes the $SiO_2$-rich portion of gradient layer 710 to bond to glass sheet 705. In various embodiments pressure can be applied between sapphire sheet 715 and glass sheet 705 during the second annealing treatment to ensure the surfaces are intimately bonded.

In each of the methods 400 and 600 for bonding a sapphire sheet to a glass sheet described above, the composition profiles of $Al_2O_3$ and $SiO_2$ within the gradient layer can change considerably from an as-deposited composition profile as initially formed to a final composition profile after the one or more annealing treatments, as described in more detail below.

Figure 8:
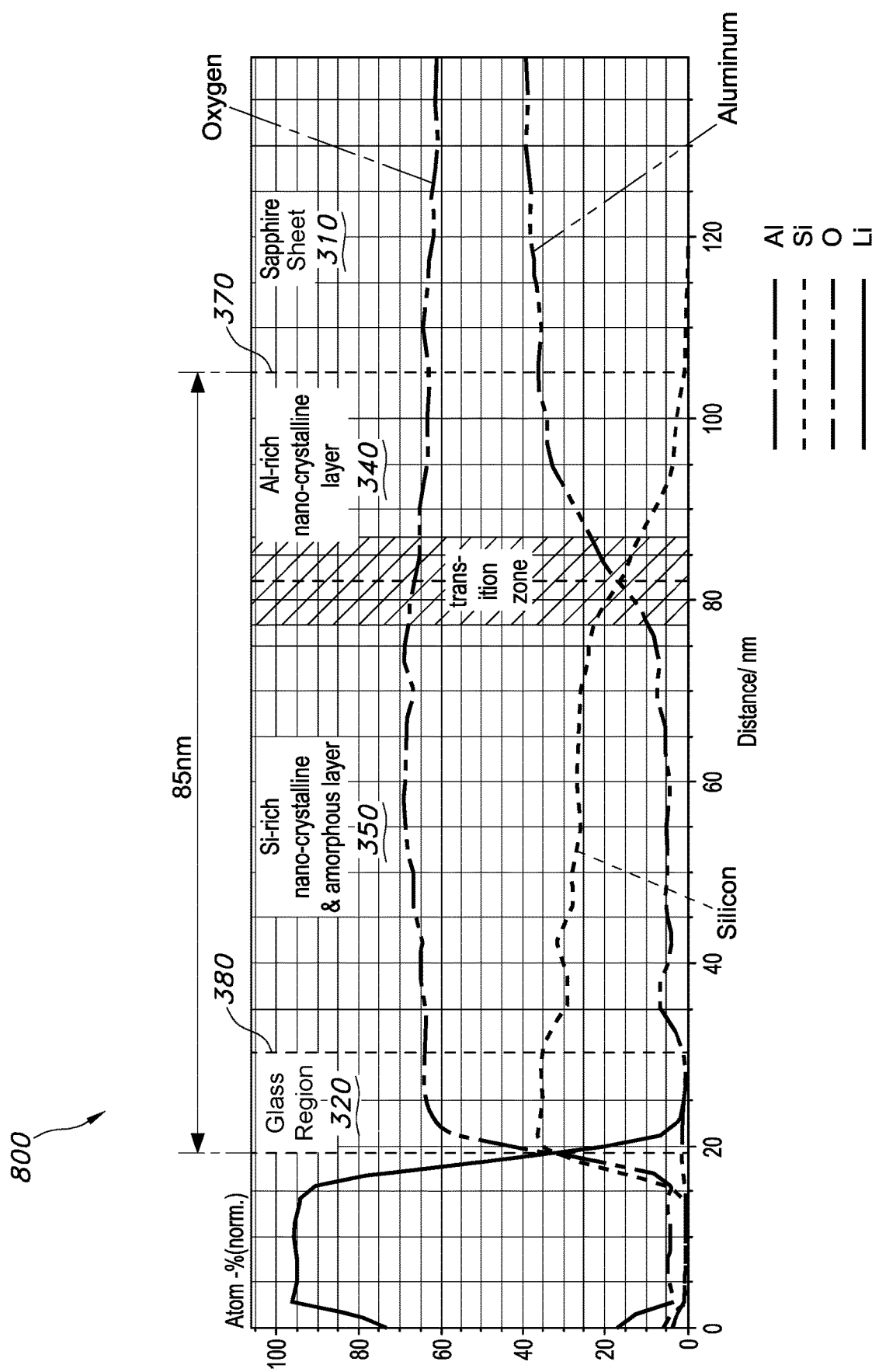
FIG. 8 illustrates an example composition profile of a laminated cover glass according to embodiments of the disclosure.

FIG. 8 illustrates one example of a final composition profile 800 of a completed laminated cover glass formed according to embodiments of the disclosure, including either method 400 or method 600. As shown in FIG. 8, in some embodiments a final composition profile 800 of gradient layer 330 can change throughout its thickness in a non-linear manner. The various portions of final composition profile 800 are referred to below using reference numbers depicted in FIG. 3, and to facilitate the description of final composition profile 800 reference is sometimes made simultaneously to FIGS. 3 and 8.

Final composition profile 800 illustrates sapphire sheet 310 on the right and glass sheet 320 on the left. Starting at sapphire sheet 310, the composition of the sapphire sheet is reasonably constant showing stable atomic percentages of oxygen and aluminum. Progressing towards first interface 370 (between sapphire sheet 310 and gradient layer 330), the atomic percentage of silicon starts to gradually increase due to the diffusion of silicon into the sapphire sheet from the gradient layer. Progressing through first interface 370 and into gradient layer 330 an aluminum-rich nano-crystalline $Al_2O_3$ layer 340 can include nano-crystals of $Al_2O_3$ that have been formed at the sapphire surface. In some embodiments the nano-crystals can have the same crystalline orientation as that of sapphire sheet 310, while in other embodiments they can have a different crystalline orientation. As shown in FIG. 8, the composition in aluminum-rich nano-crystalline $Al_2O_3$ layer 340 can be primarily aluminum and oxygen and can be approximately 20 nanometers thick.

Moving further towards glass sheet 320, aluminum-rich nano-crystalline $Al_2O_3$ layer 340 can transition to a silicon-rich nano-crystalline and amorphous layer 350. More specifically, in some embodiments, at first interface 370, primarily nano-crystalline $Al_2O_3$ exists and moving towards glass sheet 320 the composition of gradient layer 330 transitions to amorphous $Al_2O_3$. In one example the composition of silicon-rich nano-crystalline and amorphous layer 350 can be a mixture of oxygen, silicon and aluminum and can be between 10 to 50 nanometers thick.

Moving further towards glass sheet 320, in some embodiments silicon-rich nano-crystalline and amorphous layer 350 can transition to amorphous silicon dioxide such that it is predominantly silicon dioxide at the surface of glass sheet 320. In various embodiments, as silicon-rich nano-crystalline and amorphous layer 350 transitions to glass sheet 320, the percent composition of aluminum reduces and diminishes to near zero at second interface 380 (between glass sheet 320 and gradient layer 330). Moving further towards glass sheet 320 the composition is predominantly silicon and oxygen within glass sheet 320, with trace amounts of aluminum that have diffused into the glass sheet from gradient layer 330.

The layer thicknesses and chemical compositions illustrated in FIG. 8 are for example only and other thicknesses and compositions are within the scope of this disclosure.

Figure 9:
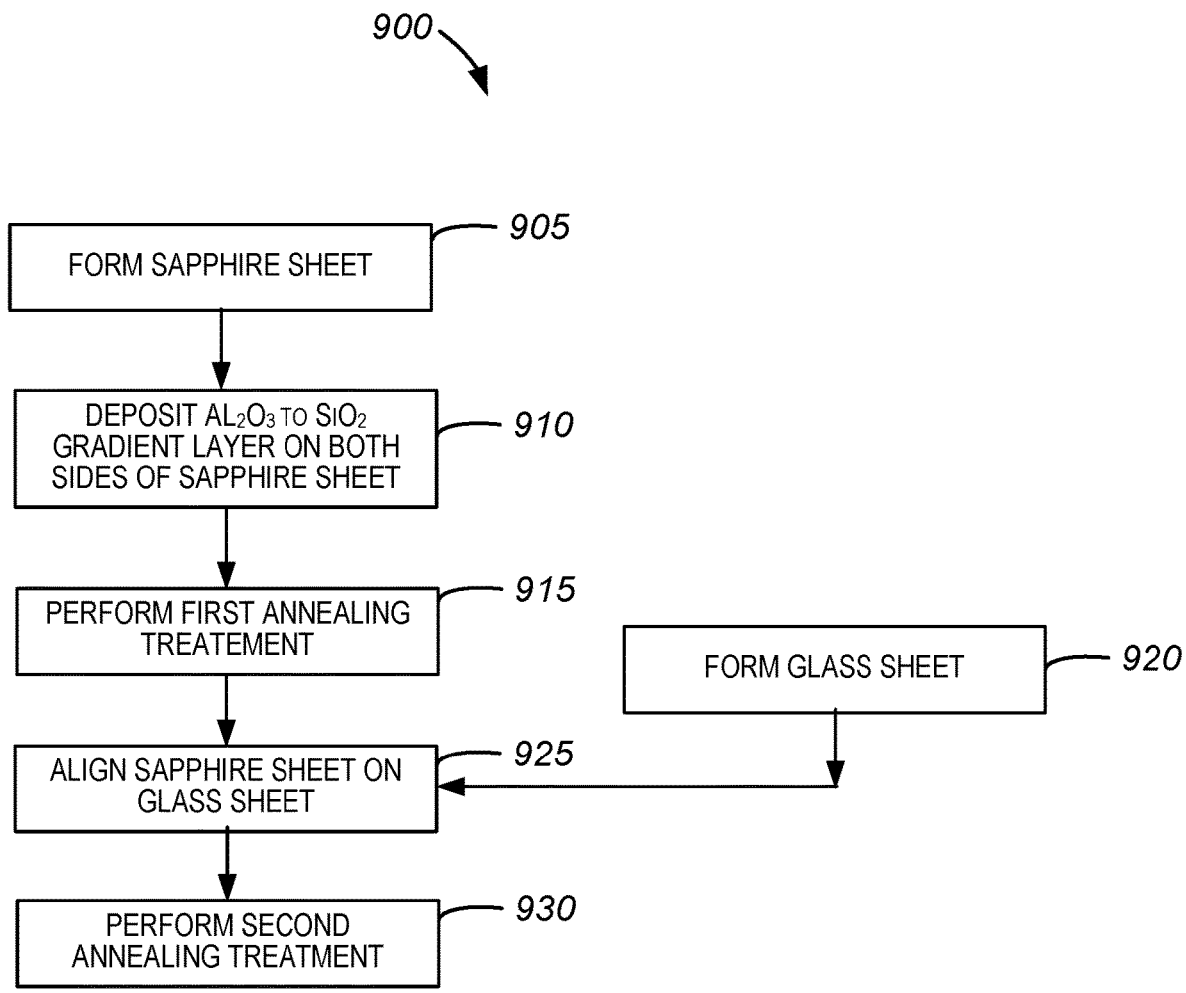
FIG. 9 illustrates steps associated with a method of bonding a sapphire sheet having a gradient layer on both sides to a glass sheet according embodiments of the disclosure.

FIG. 9 illustrates steps associated with a method of bonding a sapphire sheet having a gradient layer on both sides to a glass sheet according embodiments of the disclosure. FIGS. 10A-10D illustrate simplified cross-sectional views of a sapphire sheet being bonded to a glass sheet according to the method described in FIG. 9. As described in FIG. 9, a gradient layer is deposited on both sides of the sapphire sheet, instead of only on one side of the sapphire sheet as discussed in the embodiments described above in FIGS. 5A-8. Depositing a gradient layer on both sides of the sapphire sheet can reduce bowing of the sapphire sheet, as described in more detail below.

Figure 10A:
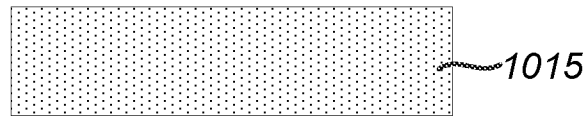
FIGS. 10A-10D illustrate simplified cross-sectional views of a sapphire sheet being bonded to a glass sheet according to the method described in FIG. 9.
Figure 10B:
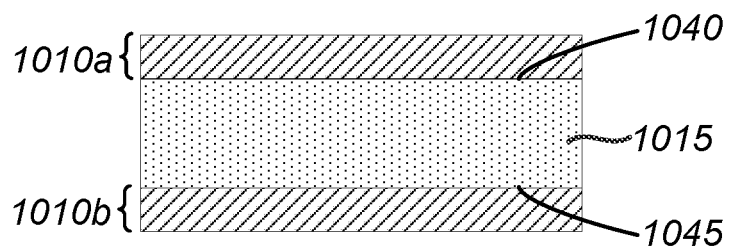

As illustrated in FIG. 9, in step 905 a sapphire sheet of $Al_2O_3$ is formed using any appropriate manufacturing technique. Referring to FIG. 10A, sapphire sheet 1015 is provided. In some embodiments sapphire sheet 1015 is between 5 to 100 microns thick, while in other embodiments the sapphire sheet is between 10 to 80 microns thick and in further embodiments the sapphire sheet is between 20 to 70 microns thick.

In step 910 a first $Al_2O_3$ to $SiO_2$ gradient layer 1010a (see FIG. 10B) is deposited on a first side 1040 of sapphire sheet 1015 and a second $Al_2O_3$ to $SiO_2$ gradient layer 1010b is deposited on a second side 1045 of the sapphire sheet. In some embodiments first and second gradient layers 1010a, 1010b, respectively, are amorphous layers deposited using the same type of PVD sputtering process described above with respect to FIG. 4. In some embodiments the gradient layers can be deposited simultaneously while in other embodiments they can be deposited sequentially. In this example, first and second gradient layers 1010a, 1010b, respectively, start with $Al_2O_3$ at the sapphire surface so the $Al_2O_3$ can form a bond with sapphire sheet 1015. In some embodiments the composition of first and second gradient layers 1010a, 1010b, respectively, can be linear while in other embodiments it can be non-linear. The deposition first and second gradient layers 1010a, 1010b, respectively, on either side of sapphire sheet 1015 can "balance" the stresses in the sapphire sheet and reduce bowing of the sapphire sheet as compared to embodiments that have a gradient layer coated on only one side, such as the example illustrated in FIG. 4.

In step 915 a first annealing treatment on sapphire sheet 1015 with first and second gradient layers 1010a, 1010b, respectively, is performed. The first annealing treatment is performed at a temperature sufficient to chemically bond first and second gradient layers 1010a, 1010b, respectively, to sapphire sheet 1015. In some embodiments the first annealing treatment is performed in an inert or non-inert atmosphere at a final annealing temperature greater than 1000° C. In another embodiment the final annealing temperature of the first annealing treatment can be above 1200° C. In one embodiment the first annealing treatment temperature ramps to the final annealing temperature in four to six hours, is held at the final annealing temperature for approximately two hours, then ramps back to the ambient temperature over approximately 16 hours. In other embodiments different temperatures and ramp profiles can be used including using laser annealing.

Figure 10C:
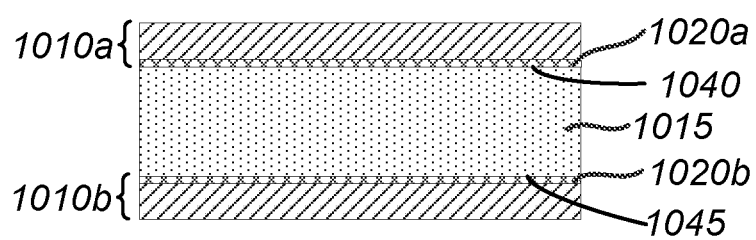

As shown in FIG. 10C, in some embodiments, the first annealing treatment causes first and second layers of nano-crystals 1020a, 1020b, respectively, of $Al_2O_3$ to form on first and second sides 1040, 1045, respectively of sapphire sheet 1015. More specifically, during the relatively high temperatures in the first annealing treatment, nano-crystals nucleate on the crystalline lattice on both sides of sapphire sheet 1015. In some embodiments the nano-crystals have the same crystalline orientation as sapphire sheet 1015 while in other embodiments the nano-crystals can have a different orientation than the sapphire sheet. The nano-crystals nucleate out of first and second gradient layers 1010a, 1010b, respectively, and grow during the first annealing treatment. The amount and size of the nano-crystals that are formed can be controlled by controlling the time and temperature profile of the first annealing treatment.

In step 920, which can be performed independent of steps 905 to 915, method 400 includes forming a glass sheet 1030 using any appropriate manufacturing technique. In some embodiments a glass sheet 1030 is provided that is between 100 to 1000 microns thick, while in other embodiments the glass sheet is between 300 to 800 microns thick and in further embodiments the glass sheet is between 400 to 700 microns thick. In various embodiments glass sheet 1030 is made from silicon dioxide and can be chemically strengthened and/or configured to block infra-red light.

Figure 10D:
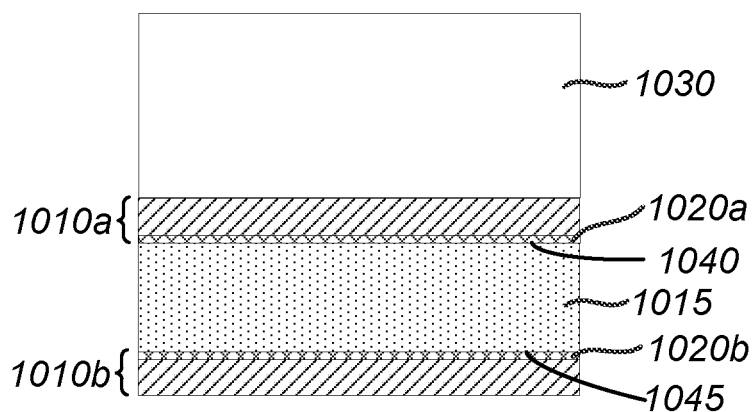

In step 925, glass sheet 1030 is aligned with and placed on top of first gradient layer 1010a, as illustrated in FIG. 10D.

In step 930 a second annealing treatment is performed at a lower temperature than the first annealing treatment described in step 915. In some embodiments the second annealing treatment is performed in an ambient atmosphere and at a final annealing temperature of approximately 125° C. As shown in FIG. 10D, in some embodiments, the second annealing treatment causes first gradient layer 1010a, which is rich in $SiO_2$ at the interface between the gradient layer and glass sheet 1030, to chemically bond to the glass sheet. In some embodiments pressure can be applied between sapphire sheet 1015 and glass sheet 1030 during the second annealing treatment to ensure the surfaces are intimately bonded.

As discussed above, the deposition first and second gradient layers 1010a, 1010b, respectively, on either side of sapphire sheet 1015 can reduce bowing of the sapphire sheet as compared to embodiments that have a gradient layer coated on only one side. Further, the reduced bowing can enable improved adhesion and lamination to glass sheet 1030 (see FIG. 10D) and can also reduce bowing in the completed laminated structure, illustrated in FIG. 10D.

In embodiments where a reduced surface reelection is desired, second gradient layer 1010b can exhibit a surface reelection of approximately 4 percent or less as compared to sapphire sheet 1015 that exhibits a surface reflection of approximately 8 percent.

In some embodiments where the improved scratch resistant properties of the sapphire sheet are desired on the outer surface of the electronic device, second gradient layer 1010b can be polished off after lamination to glass sheet 1030. In various embodiments a different type of coating can be applied on second side 1045 of sapphire sheet 1015 in place of second gradient layer 1010b. For example, in one embodiment a diamond like carbon coating can be applied on second side 1045. In some embodiments the different coating can offer improved scratch resistance (e.g., better than second gradient layer 1010b) and can also reduce bowing as described above. In various embodiments the different coating can be selected to have an appropriate coefficient of thermal expansion and/or modulus to counterbalance first gradient layer 1010a and can also offer improved scratch resistant properties over second gradient layer 1010b.

Other variations and embodiments are within the scope of this disclosure. For example, in another embodiment a sapphire sheet can be bonded to either side of a glass sheet. That is, a first sapphire sheet can be bonded to a first side of a glass sheet and a second sapphire sheet can be bonded to a second side of glass sheet to balance stresses within the glass sheet.

Although electronic device 100 (see FIG. 1) is described and illustrated as one particular electronic device, embodiments of the disclosure are suitable for use with a multiplicity of electronic devices. For example, any device that receives or transmits audio, video or data signals can be used with embodiments of the disclosure. In some instances, embodiments of the disclosure are particularly well suited for use with portable electronic media devices because of their use of transparent display screens. As used herein, an electronic media device includes any device with at least one electronic component that can be used to present human-perceivable media. Such devices can include, for example, portable music players (e.g., MP3 devices and Apple's iPod devices), portable video players (e.g., portable DVD players), cellular telephones (e.g., smart telephones such as Apple's iPhone devices), video cameras, digital still cameras, projection systems (e.g., holographic projection systems), gaming systems, PDAs, as well as tablet (e.g., Apple's iPad devices), laptop or other mobile computers. Some of these devices can be configured to provide audio, video or other data or sensory output.

For simplicity, various internal components, such as the control circuitry, graphics circuitry, bus, memory, storage device and other components of electronic device 100 (see FIG. 1) are not shown in the figures.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. An electronic device including a transparent cover glass, the electronic device comprising:
   a housing;
   a display positioned within the housing;
   a cover glass disposed over the display and attached to the housing, the cover glass comprising:
      a sapphire sheet;
      a glass sheet; and
      a gradient layer disposed between the sapphire sheet and the glass sheet and that transitions from a composition that is predominantly $Al_2O_3$ at the sapphire sheet to a composition that is predominantly $SiO_2$ at the glass sheet, and wherein the gradient layer includes a first region including nanocrystalline $Al_2O_3$ positioned proximate the sapphire sheet and a second region including amorphous $Al_2O_3$ positioned between the nanocrystalline $Al_2O_3$ and the glass sheet.

2. The electronic device of claim 1 wherein the gradient layer gradually transitions from a composition that is predominantly $Al_2O_3$ at the sapphire sheet to a composition that is predominantly $SiO_2$ at the glass sheet.

3. The electronic device of claim 1 wherein the gradient layer is between 25 and 300 nanometers thick.

4. A glass and sapphire laminate comprising:
   a sapphire sheet;
   a glass sheet; and
   a gradient layer disposed between the sapphire sheet and the glass sheet and that transitions from a composition that is predominantly $Al_2O_3$ at the sapphire sheet to a composition that is predominantly $SiO_2$ at the glass sheet, and wherein the gradient layer includes a first region including nanocrystalline $Al_2O_3$ positioned proximate the sapphire sheet and a second region including amorphous $Al_2O_3$ positioned between the nanocrystalline $Al_2O_3$ and the glass sheet.

5. The laminate of claim 4 wherein the $Al_2O_3$ nanocrystals have a crystalline orientation that matches a crystalline orientation of the sapphire sheet.

6. The laminate of claim 4 wherein the $Al_2O_3$ nanocrystals have a crystalline orientation that is different from a crystalline orientation of the sapphire sheet.

7. The laminate of claim 4 wherein when moving in a direction away from the sapphire sheet, the gradient layer transitions from the layer of $Al_2O_3$ nanocrystals to a mixture of $Al_2O_3$ nanocrystals and amorphous $Al_2O_3$.

8. The laminate of claim 7 wherein when moving in a direction away from the sapphire sheet, the gradient layer transitions from the mixture of $Al_2O_3$ nanocrystals and amorphous $Al_2O_3$ to predominantly amorphous $SiO_2$.

9. The laminate of claim 4 wherein the gradient layer gradually changes in chemical composition from predominantly $Al_2O_3$ to predominantly $SiO_2$.

10. The laminate of claim 4 wherein the gradient layer is between 25 and 300 nanometers thick.

11. The laminate of claim 4 wherein the sapphire sheet is between 5 and 100 microns thick.

12. The laminate of claim 4 wherein the glass sheet is between 100 and 1000 microns thick.

13. The laminate of claim 4 wherein the gradient layer is a first gradient layer and the laminate further comprises a second gradient layer that is disposed on the sapphire sheet on a side opposite of the first gradient layer.

14. A method of bonding a sapphire sheet to a glass sheet, the method comprising:
   depositing a gradient layer on a first surface of the sapphire sheet, wherein the gradient layer is predominantly composed of $Al_2O_3$ at the sapphire sheet and transitions to predominantly $SiO_2$ at an outer surface of the gradient layer;
   annealing the sapphire sheet and the gradient layer at a temperature sufficient to chemically bond the gradient layer to the sapphire sheet;
   disposing a glass sheet on the outer surface of the gradient layer; and
   annealing the glass sheet, the gradient layer and the sapphire sheet at a temperature sufficient to chemically bond the glass sheet to the gradient layer, and
   wherein the gradient layer includes a first region including nanocrystalline $Al_2O_3$ positioned proximate the sapphire sheet and a second region including amorphous $Al_2O_3$ positioned between the nanocrystalline $Al_2O_3$ and the glass sheet.

15. The method of claim 14 wherein the gradient layer is deposited as an amorphous layer having a substantially linear gradient that varies from predominantly $Al_2O_3$ at the sapphire sheet to predominantly $SiO_2$ at an outer surface of the gradient layer.

16. The method of claim 14 wherein the sapphire sheet is annealed at a temperature above a softening point of the glass sheet.

17. The method of claim 14 wherein annealing the sapphire sheet and the gradient layer causes a layer of $Al_2O_3$ nanocrystals to form at an interface between the gradient layer and the sapphire sheet.

18. The method of claim 14 wherein the gradient layer is also deposited on a second surface of the sapphire sheet that is opposite the first surface.

* * * * *